United States Patent
Lai et al.

(10) Patent No.: US 7,019,389 B2
(45) Date of Patent: Mar. 28, 2006

(54) LEAD FRAME AND SEMICONDUCTOR PACKAGE WITH THE SAME

(75) Inventors: Jeng-Yuan Lai, Taichung (TW);
Yuan-Lin Tzeng, Taichung (TW);
Ya-Yi Lai, Taichung (TW)

(73) Assignee: Siliconware Precision Industries Co., Ltd., (TW)

( * ) Notice: Subject to any disclaimer, the term of this patent is extended or adjusted under 35 U.S.C. 154(b) by 56 days.

(21) Appl. No.: 10/782,660

(22) Filed: Feb. 18, 2004

(65) Prior Publication Data
US 2005/0098860 A1   May 12, 2005

(30) Foreign Application Priority Data
Nov. 10, 2003   (TW) ................ 92131371 A

(51) Int. Cl.
*H01L 23/34*   (2006.01)

(52) U.S. Cl. ...................... 257/666; 257/668

(58) Field of Classification Search .............. 257/666, 257/668, 670
See application file for complete search history.

(56) References Cited

U.S. PATENT DOCUMENTS 6,208,023 B1 * 3/2001 Nakayama et al. ......... 257/696
6,853,059 B1 * 2/2005 Jang ............................ 257/675

* cited by examiner

*Primary Examiner*—Ngân V. Ngô
*Assistant Examiner*—Thinh T Nguyen
(74) *Attorney, Agent, or Firm*—Peter F. Corless; Steven M. Jensen; Edwards Angell Palmer & Dodge, LLP

(57) ABSTRACT

A lead frame and a semiconductor package with the lead frame are provided. The lead frame includes a die pad for mounting at least one semiconductor chip thereon; at least one grounding portion protruded from the die pad; and a plurality of leads. The grounding portion has a grounding surface and an opposing bottom surface, wherein the thickness of the grounding portion is smaller than that of the die pad, and a ground pad is formed on the grounding surface for connecting at least one grounding wire to the chip for transmitting ground signals. A plurality of bonding wires are connected from the chip to the leads such that the chip can be electrically connected to an external device via the bonding wires and leads. By the above arrangement, the grounding wire can be prevented from breakage by thermal stress in a high-temperature process, and the production yield is improved.

20 Claims, 8 Drawing Sheets

LEAD FRAME AND SEMICONDUCTOR PACKAGE WITH THE SAME

FIELD OF THE INVENTION

The present invention relates to semiconductor packages, and more particularly, to a lead-frame-based semiconductor package, which can prevent grounding wires in the semiconductor package from damage by thermal stress in high-temperature manufacturing processes.

BACKGROUND OF THE INVENTION

In a conventional semiconductor package using a lead frame as a chip carrier, such as quad flat package (QFP) or quad flat non-leaded (QFN) package, a semiconductor chip is mounted on a die pad of the lead frame and electrically connected to the lead frame by a plurality of bonding wires that are bonded to bond pads formed on the chip and corresponding leads of the lead frame. The chip and the bonding wires are encapsulated by an encapsulation body to form the semiconductor package. A surface of the die pad, which is not mounted with the chip, can be exposed from the encapsulation body to facilitate dissipation of heat generated by the chip in the semiconductor package.

In order to protect the electrical performance of a highly integrated chip against noises generated from operation of complex circuits, it is important to improve the grounding quality for the chip during package development. A conventional strategy is to transmit ground signals from the chip to an external device. Referring to FIG. 1, a plurality of ground pads 10 are formed on peripheral area of the die pad 11, and the ground signals can be transmitted from the chip 12 to the ground pads 10 of the die pad 11 via a plurality of grounding wires 13 and then via a plurality of bonding wires 15 to outer leads 16 that are in electrical connection with the external device (not shown). However, in a high-temperature manufacturing process, mismatch in coefficient of thermal expansion (CTE) may lead to delamination between the die pad 11 and the encapsulation body 14. As a result, the grounding wires 13 connected to the die pad 11 are easily broken, thus having poor electrical performance. This situation becomes severe for a semiconductor package with an exposed die pad since the exposed die pad is not firmly encapsulated by the encapsulation body, making delamination between such a die pad and the encapsulation body more possibly occur.

In order to solve the foregoing drawbacks, U.S. Pat. Nos. 5,169,725, 5,237,202, 5,399,809, 5,734,198 and 5,777,265 disclose the use of a multi-layered lead frame, which is modified not forming the grounding wires on the peripheral area of the die pad. The modified technology is to form a ground plane and a power plane in the lead frame, and allow a plurality of grounding wires and power wires to be connected respectively from the ground plane and power plane to the chip. However, such a multi-layered lead frame is complex and cost-ineffective to fabricate, and thus is not commonly utilized in semiconductor packages especially for those sought to be miniaturized in size.

U.S. Pat. No. 5,814,877 discloses a single-layered lead frame. Referring to FIG. 2A and FIG. 2B, a continuous grounding ring 22 is formed and separate from the die pad 21 of the lead frame 20, and the grounding ring 22 is electrically connected to the chip 23 via a plurality of grounding wires 24. Similarly, referring to FIG. 3A and FIG. 3B, U.S. Pat. No. 6,437,427 discloses a lead frame 30 with a grounding ring 32 separate from the die pad 31, allowing the grounding wires 34 to electrically connect the chip 33 to the grounding ring 32 to achieve the grounding effect.

However, the foregoing lead frame with the grounding ring still possesses significant drawbacks. Such a lead frame with grounding ring is relatively complex to fabricate, which is usually formed by stamping and easily results in residual stress on the grounding ring, making the grounding ring deformed during a subsequent high-temperature manufacturing process and thus leading to structural damage and poor electrical performance for the semiconductor package with this lead frame.

Moreover, in the use of the lead frame with grounding ring, a predetermined space between the leads and the die pad must be reserved for the grounding ring, such that wire length required for the connection between the chip and the leads should be increased and thus affects the quality of electrical connection and increases the fabrication cost. In response, a solution is to narrow the grounding ring such that the wire length can be reduced. In this case, however, when the grounding ring undergoes high-temperature manufacturing processes such as die-bond curing, wire-bonding and molding, the continuous structure of the grounding ring causes the thermal stress difficult to be released from the grounding ring, thereby resulting in deformation or "buckle" of the grounding ring as shown in FIG. 4A and FIG. 4B, which is a common phenomenon occurring in a column structure. This "buckle" deformation destroys the planarity of the grounding ring, and the grounding wires are thus uneasily formed on the grounding ring.

Further, during a wire-bonding process, it is not able to use a vacuum socket or clamping equipment, respective for securing the die pad and leads, to hold the grounding ring in position such that the grounding wires cannot be firmly connected to the grounding ring thereby damaging the bonding quality between the grounding wires and the grounding ring.

Referring to FIG. 5A, U.S. Pat. No. 6,396,139 discloses a step-like die pad 40 for increasing the contact area and adhesion between the die pad 40 and the molding compound 41. However, under a high-temperature condition, a surface 40a of the step-like part of the die pad 40 would generate more thermal expansion than another surface 40b of the die pad 40. This uneven thermal expansion causes the die pad 40 to deform and bend downwards as shown in FIG. 5B, thus generating a pulling force to pull and break the grounding wires 42.

Therefore, the problem to be solved here is to provide a semiconductor package with a lead frame, which is cost-effectively fabricated and can improve the grounding effect.

SUMMARY OF THE INVENTION

In accordance with the foregoing drawbacks of the prior arts, an objective of the present invention is to provide a lead frame and a semiconductor package with the lead frame, in which a plurality of grounding portions are protruded from a die pad of the lead frame for attaching grounding wires, so as to prevent breakage of the grounding wires due to residual thermal stress in high-temperature manufacturing processes, and thereby effectively improve the production yield of the semiconductor package.

Another objective of the invention is to provide a lead frame and a semiconductor package with the lead frame, in which a plurality of grounding portions are protruded from a die pad of the lead frame for attaching grounding wires, such that no complex grounding ring is required and thereby effectively reduces the fabrication cost for the semiconductor package.

A further objective of the invention is to provide a lead frame and a semiconductor package with the lead frame, in which a plurality of grounding portions are protruded from a die pad of the lead frame for attaching grounding wires, such that there is no need to increase the wire length, which can reduce the fabrication cost and enhance the electrical performance.

In order to achieve the foregoing and other objectives, the present invention proposes a lead frame comprising: a die pad having a top surface for mounting at least one semiconductor chip thereon, and a bottom surface; at least one grounding portion protruded from the die pad and having a grounding surface, wherein the thickness of the grounding portion is smaller than that of the die pad, and a ground pad is formed on the grounding surface of the grounding portion, allowing at least one grounding wire to be bonded to the ground pad and the semiconductor chip for transmitting ground signals; a plurality of tie bars for supporting the die pad; and a plurality of leads surrounding the die pad, for allowing a set of bonding wires to be bonded to the leads and the semiconductor chip so as to electrically connect the semiconductor chip to the leads.

A semiconductor package having the above lead frame comprises: at least one semiconductor chip; a die pad having a top surface and a bottom surface, with the semiconductor chip mounted on the top surface; at least one grounding portion protruded from the die pad and having a grounding surface, wherein the thickness of the grounding portion is smaller than that of the die pad, and a ground pad is formed on the grounding surface of the grounding portion, allowing at least one grounding wire to be bonded to the ground pad and the semiconductor chip for transmitting ground signals; a plurality of leads bonded with a set of bonding wires that are connected to the semiconductor chip so as to electrically connect the semiconductor chip to the leads via the set of bonding wires; a plurality of tie bars for supporting the die pad; and an encapsulation body for encapsulating the semiconductor chip, the die pad, the grounding portion and part of the leads.

The grounding surface of the grounding portion is lower in elevation than top surface of the die pad, or is flush with the top surface of the die pad.

The one or more grounding portions protruded from the die pad and for attaching grounding wires can desirably provide the grounding effect without requiring a complex grounding ring, and also can prevent the grounding wires from breakage due to residual thermal stress in high-temperature manufacturing processes, thereby effectively reducing the fabrication cost and improving the production yield of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a lead frame and a semiconductor package with the lead frame according to the present invention are described in detail with reference to FIGS. 6A and 6B and FIG. 7 to FIG. 10.

Figure 6A:
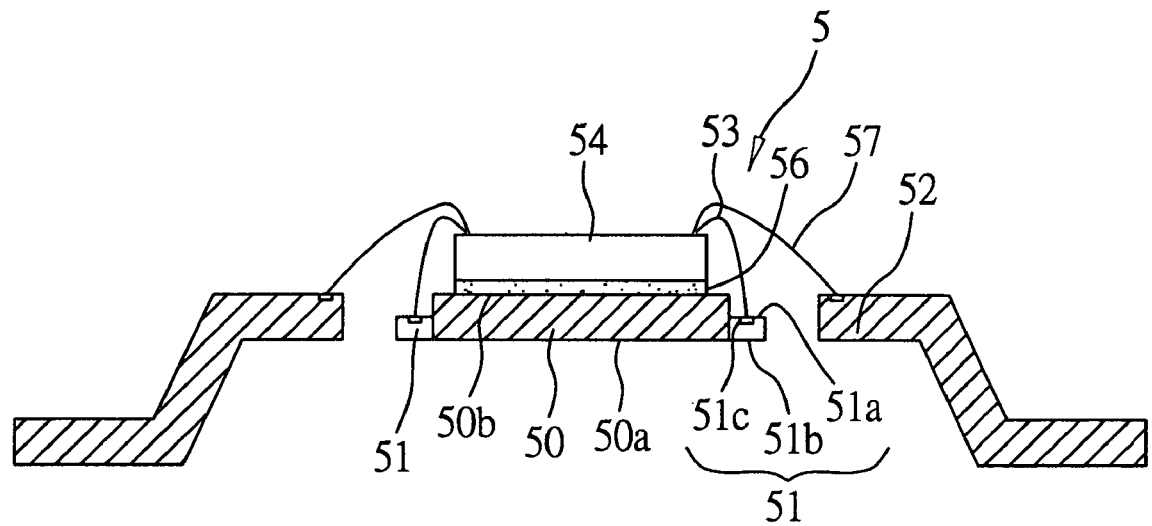
FIG. 6A is a schematic cross-sectional view of a lead frame in accordance with a preferred embodiment of the invention.
Figure 6B:
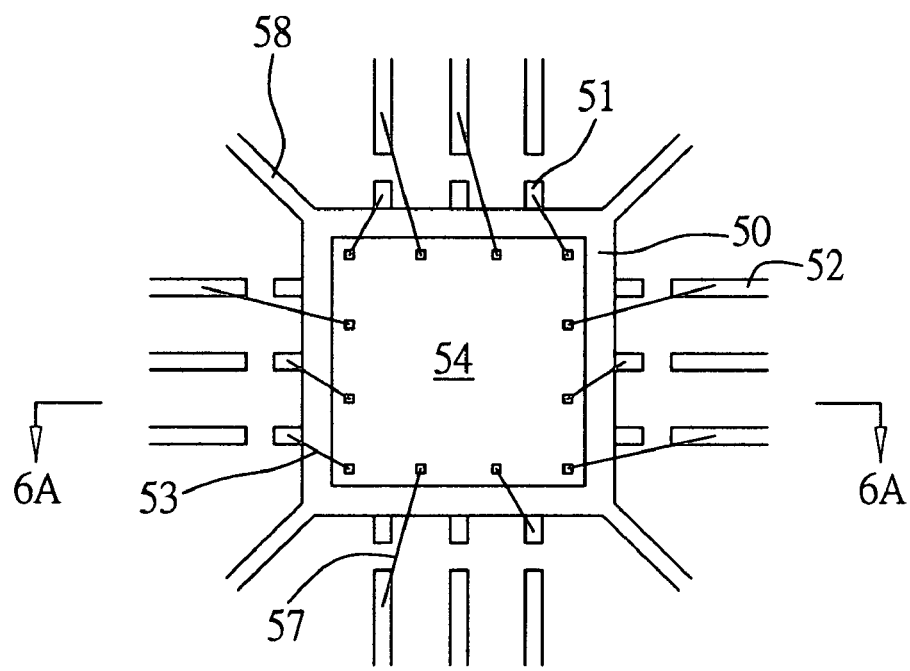
FIG. 6B is a top view of the lead frame shown in FIG. 6A along line 6A—6A.

As shown in FIG. 6A and FIG. 6B, the lead frame 5 according to the invention comprises a die pad 50, a plurality of grounding portions 51, and a plurality of leads 52.

The die pad 50 has a bottom surface 50a and a top surface 50b, for allowing at least one semiconductor chip 54 (such as wire-bonded type chip) to be attached to the top surface 50b of the die pad 50 via an adhesive 56 such as a silver paste or polyimide tape. The lead frame 5 can be made of copper or copper alloy. The die pad 50 can be an integrally-formed square die pad of the lead frame 5, or may be made by different materials and variably shaped according to practical requirements.

Figure 1:
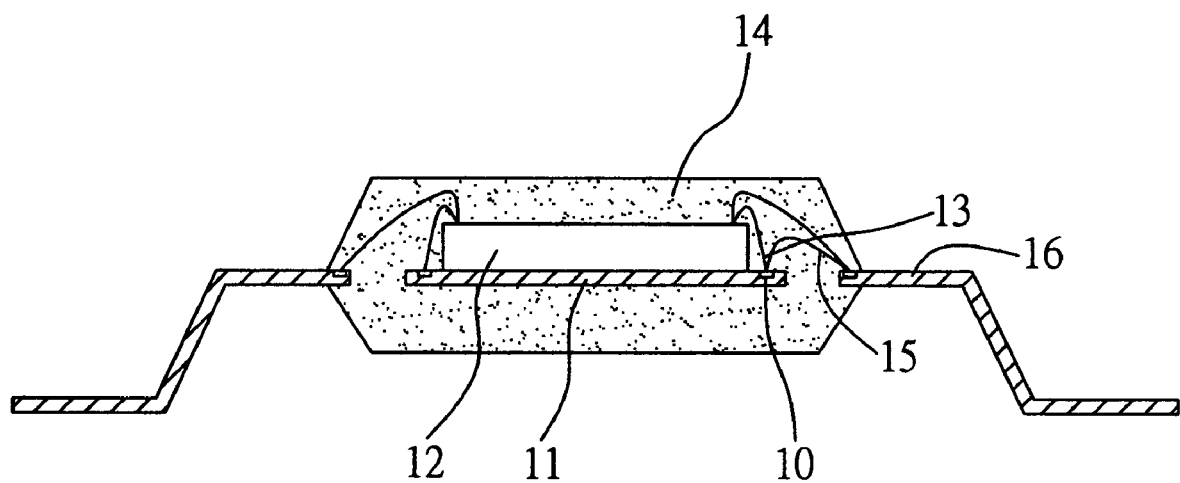
FIG. 1 (PRIOR ART) is a partial cross-sectional view of a conventional lead frame.
Figure 2A:
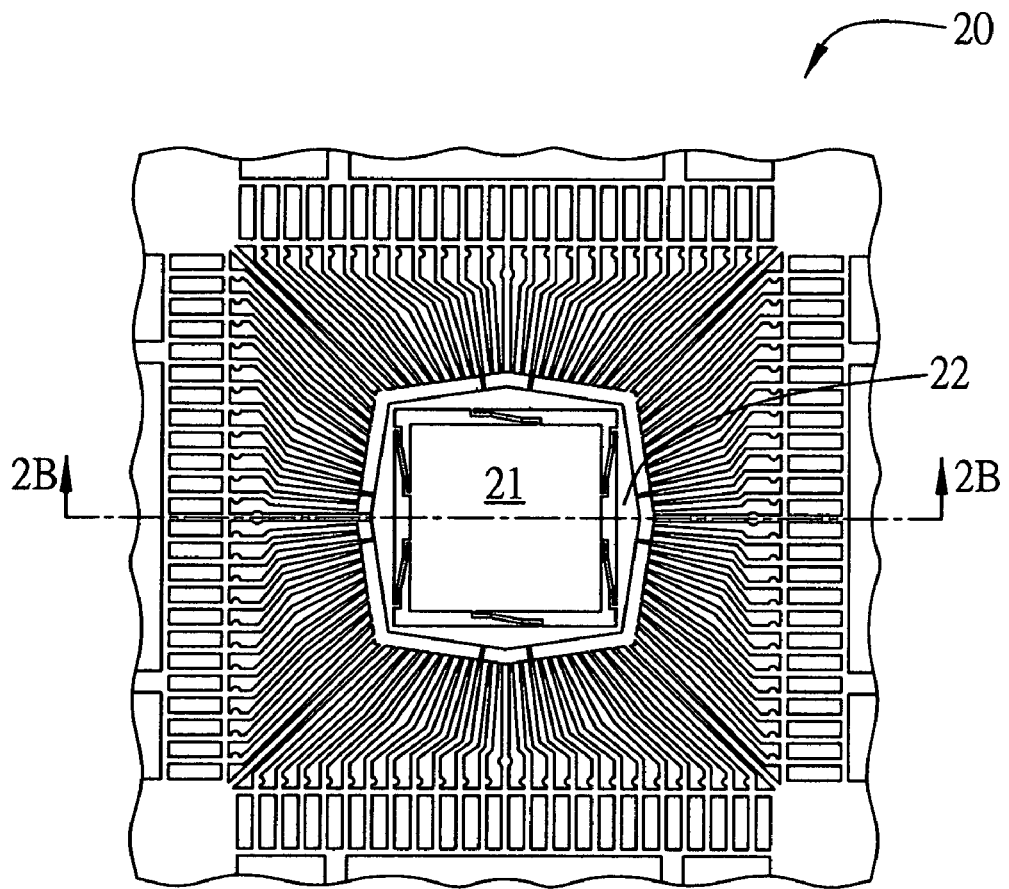
FIG. 2A (PRIOR ART) is a top view of a lead frame disclosed by U.S. Pat. No. 5,814,877.
Figure 2B:
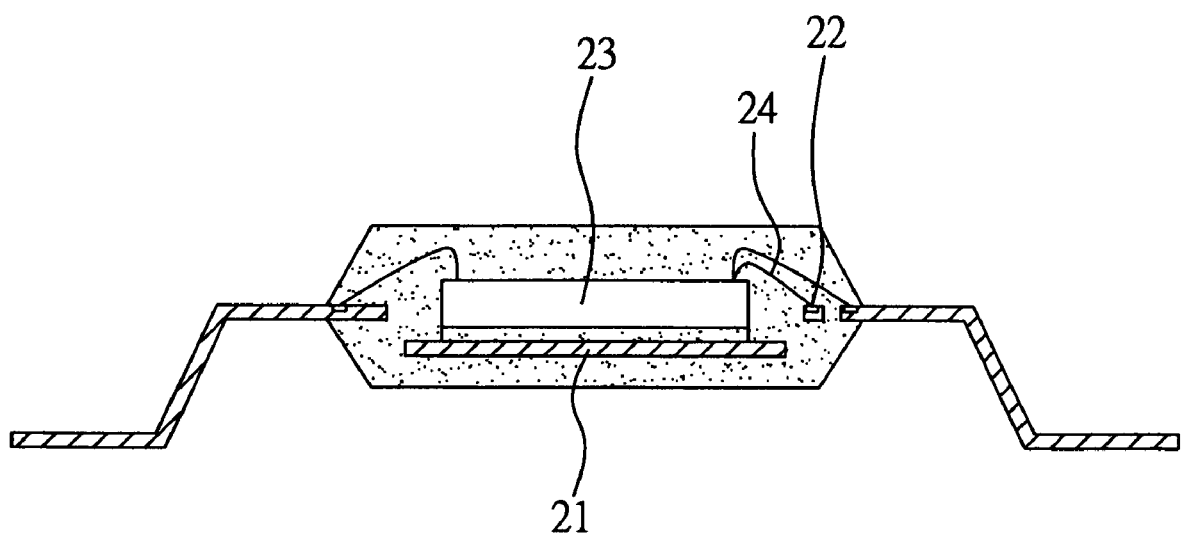
FIG. 2B (PRIOR ART) is a cross-sectional view of a semiconductor package with the lead frame shown in FIG. 2A along line 2B—2B.
Figure 3A:
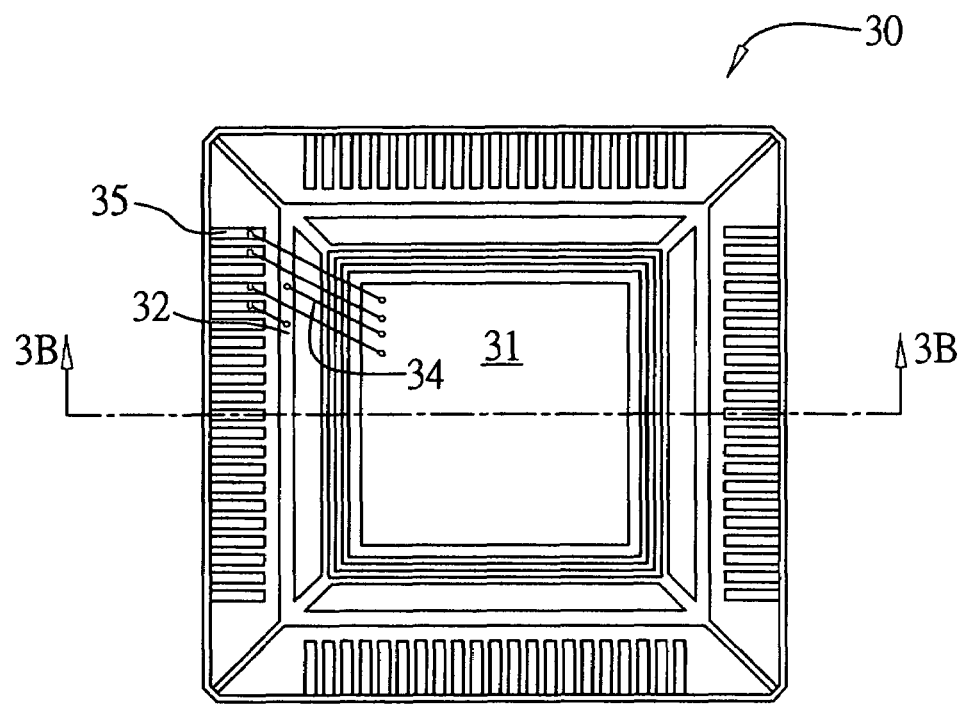
FIG. 3A (PRIOR ART) is a top view of a lead frame disclosed by U.S. Pat. No. 6,437,427.
Figure 3B:
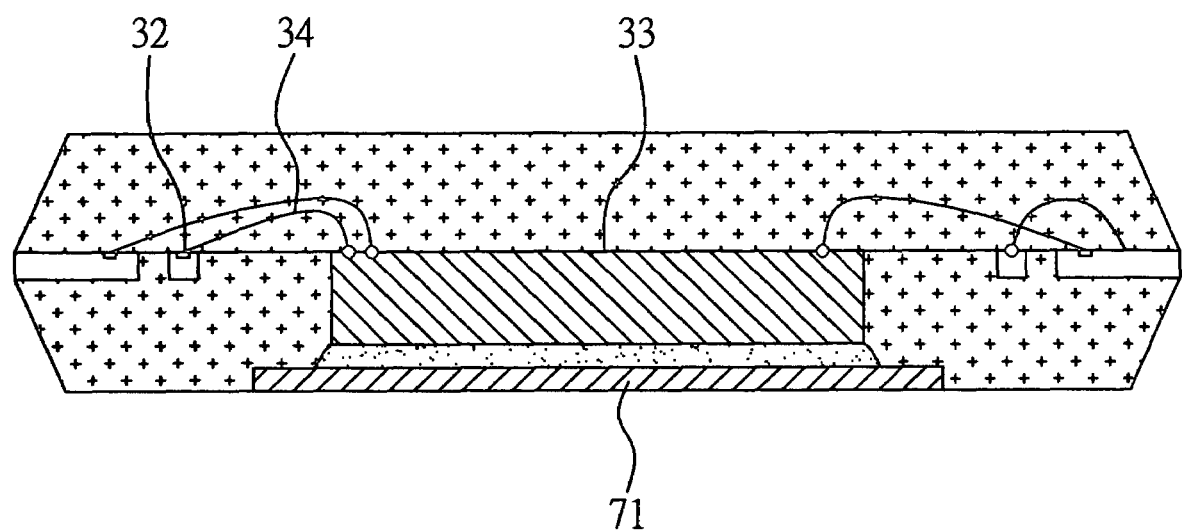
FIG. 3B (PRIOR ART) is a cross-sectional view of a semiconductor package with the lead frame shown in FIG. 3A along line 3B—3B.
Figure 4A:
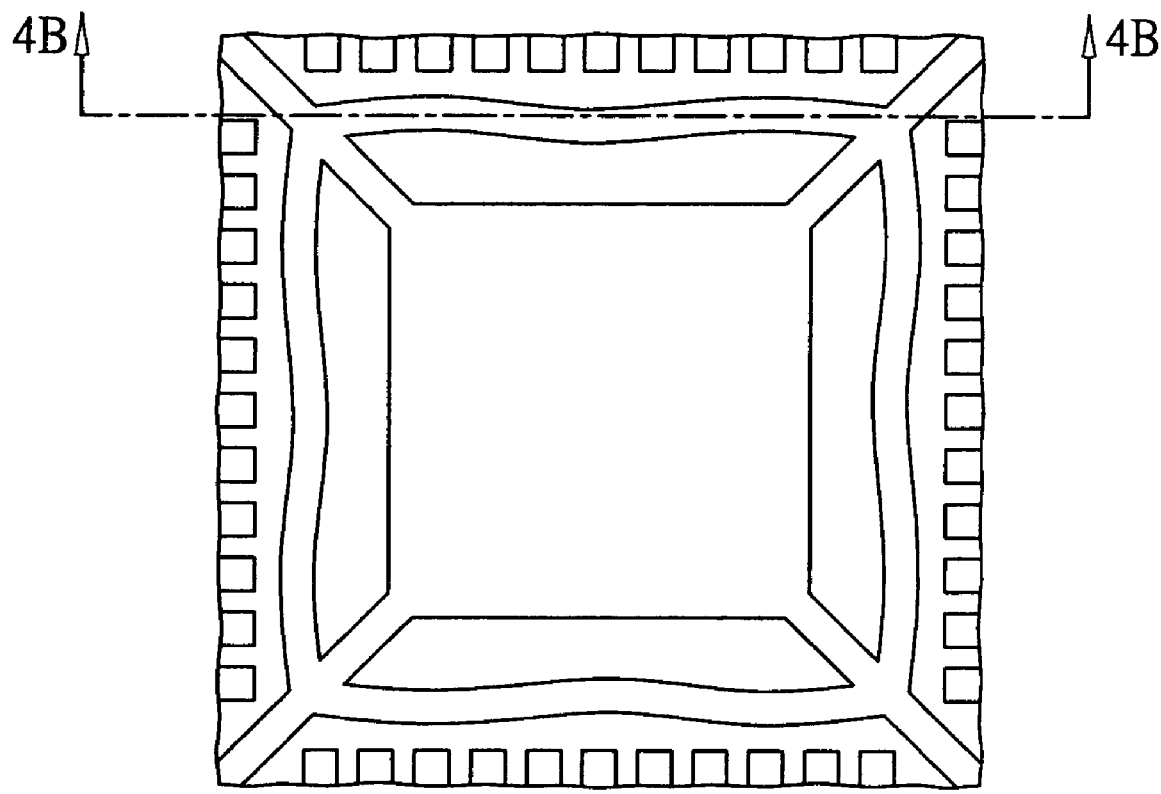
FIG. 4A and FIG. 4B (PRIOR ART) are schematic diagrams showing deformation of a grounding ring in a high-temperature manufacturing process.
Figure 4B:
Figure 5A:
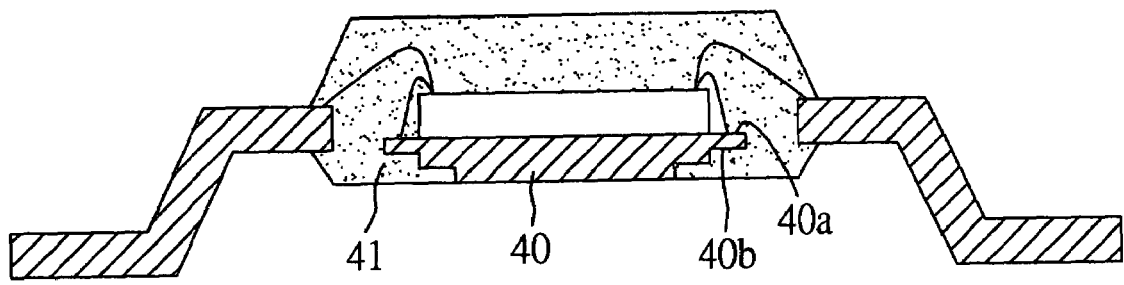
FIG. 5A (PRIOR ART) is a cross-sectional view of a semiconductor package disclosed by U.S. Pat. No. 6,396,139.
Figure 5B:
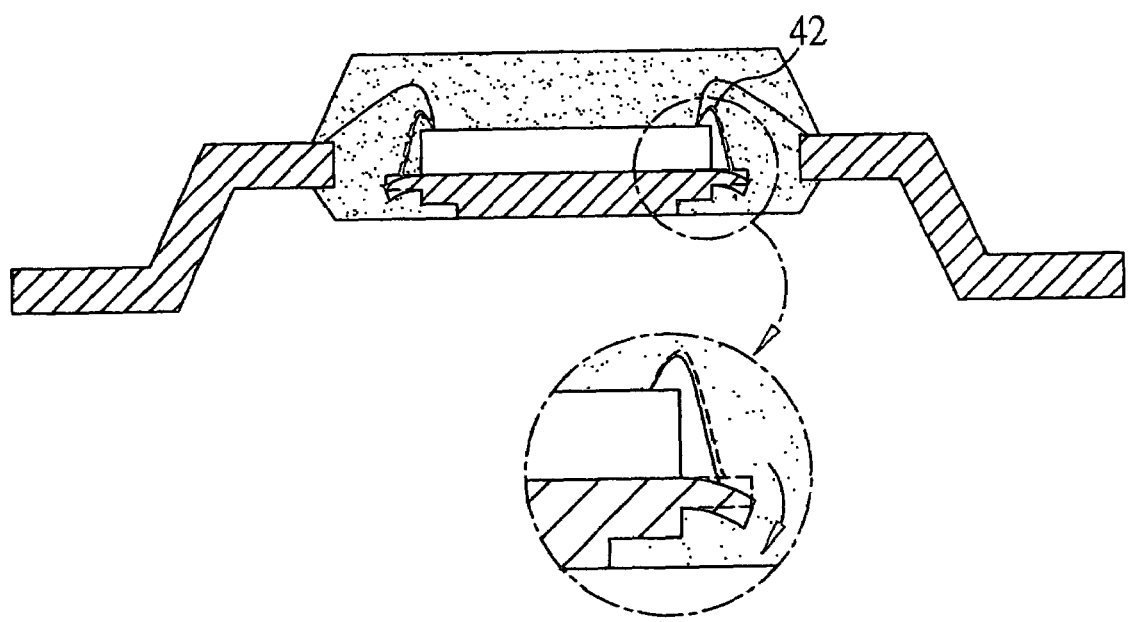
FIG. 5B (PRIOR ART) is a schematic diagram showing deformation of a die pad in the semiconductor package shown in FIG. 5A in a high-temperature manufacturing process.

Each of the grounding portions 51 is protruded from the die pad 50 and has a grounding surface 51a and a bottom surface 51b opposed to the grounding surface 51a. The grounding surface 51a of the grounding portion 51 is lower in elevation than the top surface 50b of the die pad 50. A ground pad 51c is formed on the grounding surface 51a of each grounding portion 51, and a set of grounding wires 53 are bonded to the ground pads 51c on the grounding portions 51 and to the semiconductor chip 54 for transmitting ground signals. Since a height difference is formed between the top surface 50b of the die pad 50 and the ground pad 51c of the grounding surface 51a, when the die pad 50 is subject to a high-temperature environment such as subsequent high-temperature manufacturing processes or tests, the grounding portion 51 of the die pad 50 according to the present invention is less likely to be deformed unlike the conventional die pad shown in FIG. 5B. As a result, no pulling force would be exerted on the grounding wires 53, thereby preventing the grounding wires 53 from breakage. Therefore, both the production yield and electrical performance of a semiconductor package having the lead frame 5 can be assured.

Preferably, the thickness of the grounding portion 51 is half of the thickness of the die pad 50.

The plurality of leads 52 surround the die pad 50. A set of bonding wires 57 are bonded to the leads 52 and the semiconductor chip 54, such that the semiconductor chip 54 can be electrically connected via the set of bonding wires 54 and the leads 52 to an external device (not shown) that is in electrical connection with the leads 52, and electronic signals can be transmitted from the semiconductor chip 54 to the external device.

The lead frame 5 further comprises a plurality of tie bars 58 for supporting the die pad 50. The tie bars 58 are connected to the periphery such as corner positions of the die pad 50. The die pad 50, leads 52 and tie bars 58 can be formed integrally by stamping.

Figure 7:
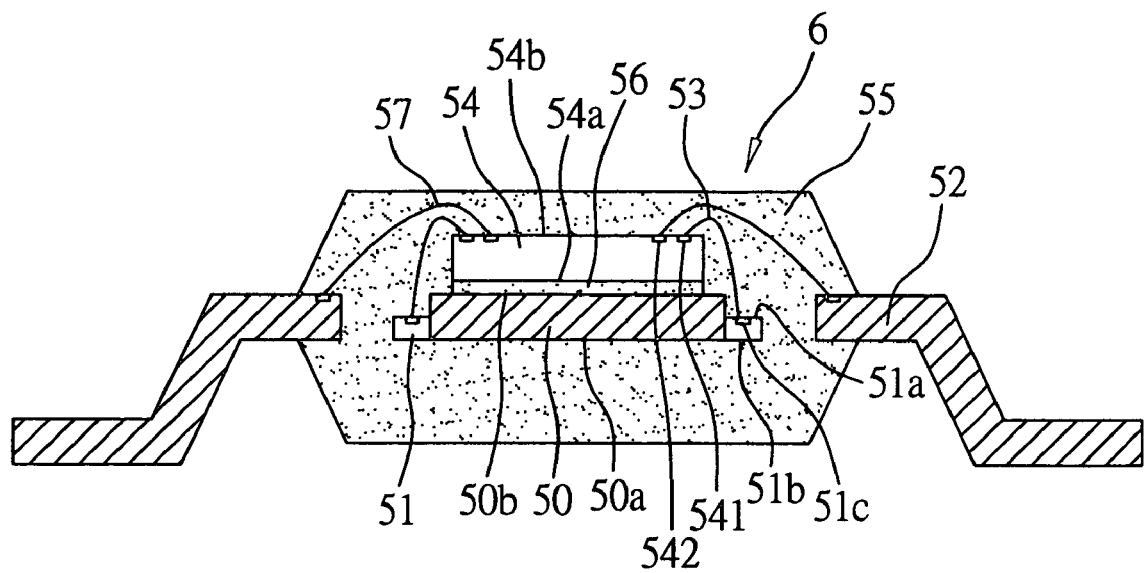
FIG. 7 is a schematic cross-sectional view of a semiconductor package having the lead frame in accordance with a preferred embodiment of the invention.

FIG. 7 shows a semiconductor package 6 having the above lead frame 5 according to the invention. Besides the lead frame 5 and the semiconductor chip 54, this semiconductor package 6 also comprises an encapsulation body 55 for encapsulating the lead frame 5 and the semiconductor chip 54, with an outer part of the leads 52 exposed from the encapsulation body 55. This semiconductor package 6 is a quad flat package (QFP).

Figure 8:
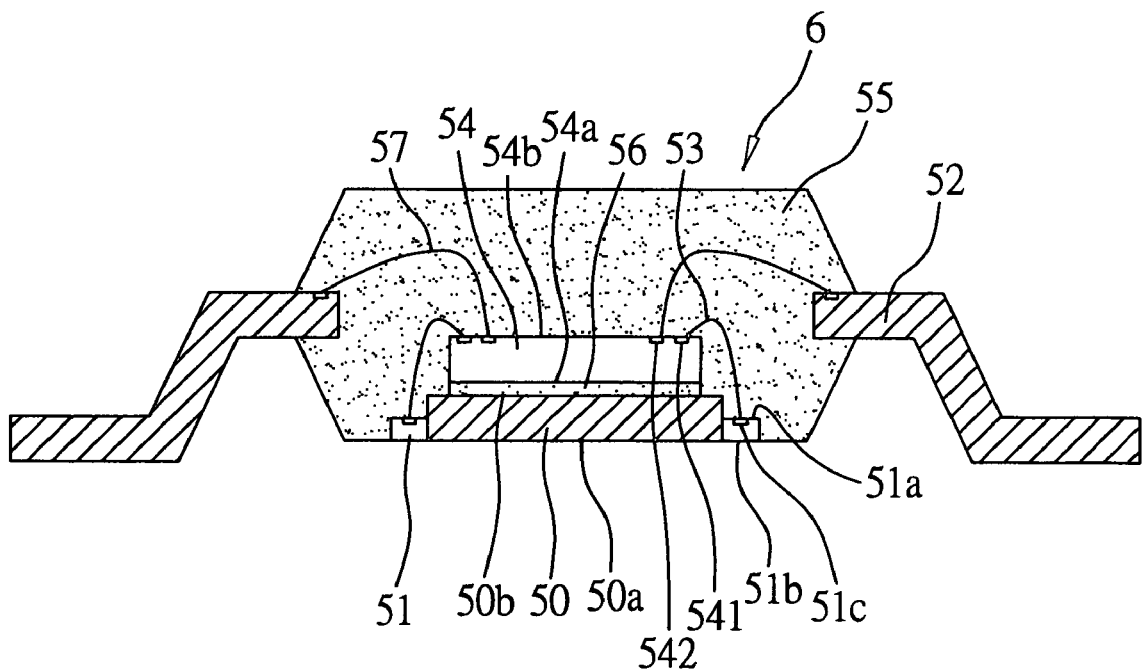
FIG. 8 is a schematic cross-sectional view of a semiconductor package having the lead frame in accordance with another preferred embodiment of the invention.

The encapsulation body 55 is formed for encapsulating the lead frame 5, the grounding wires 53, the bonding wires 57 and the semiconductor chip 54, so as to protect these components against damage from external moisture and contaminants. In this embodiment, the encapsulation body 55 is made of a resin compound such as epoxy resin by a conventional molding process. In order to increase the heat dissipation efficiency for the semiconductor package 6, the encapsulation body 55 can be made as shown in FIG. 8 to partly cover the lead frame 5, allowing the bottom surface 50a of the die pad 50 and the bottom surface 51b of each grounding portion 51 to be exposed from the encapsulation body 55.

Figure 9:
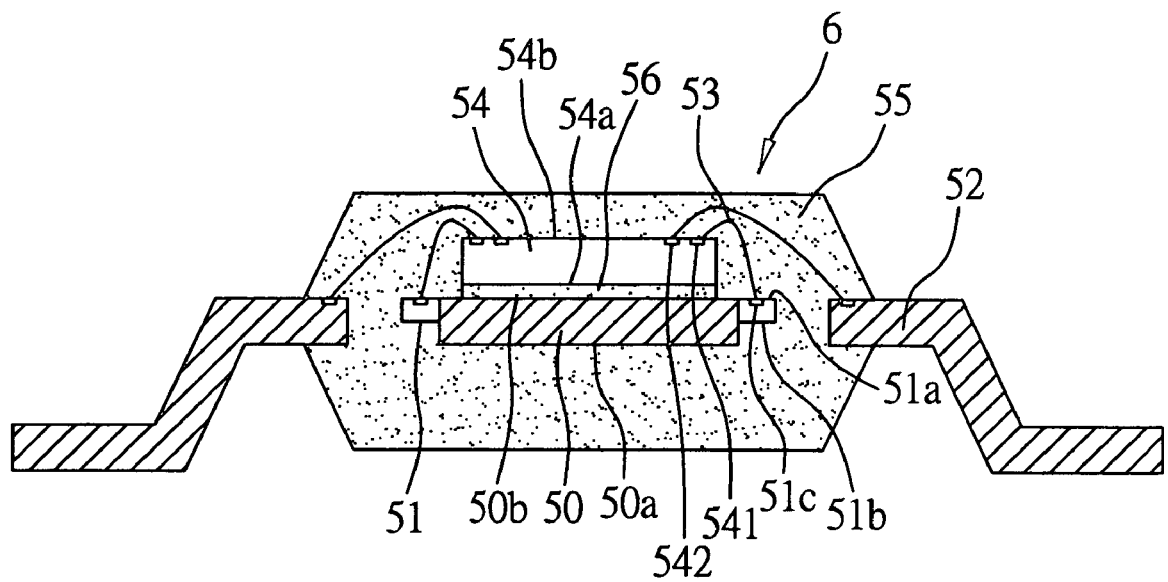
FIG. 9 is a schematic cross-sectional view of a semiconductor package having the lead frame in accordance with a further preferred embodiment of the invention.

FIG. 9 shows the semiconductor package 6 according to another embodiment of the invention. As shown in FIG. 9, this semiconductor package 6 is mostly the same in structure as that shown in FIG. 7 and only differs in that the grounding surface 51a of the grounding portion 51 is flush with the top surface 50b of the die pad 50; the grounding portion 51 is also preferably half in thickness of the die pad 50. Similarly, this semiconductor package 6 of FIG. 9 has the benefits of preventing the die pad 50 from deformation and preventing the grounding wires 53 from breakage in the high-temperature environment.

Figure 10:
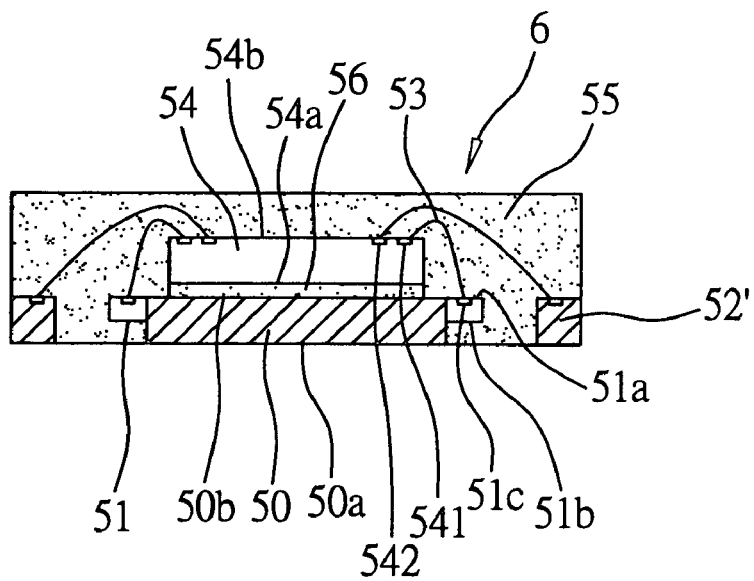
FIG. 10 is a schematic cross-sectional view of a semiconductor package having the lead frame in accordance with a further preferred embodiment of the invention.

FIG. 10 shows the semiconductor package 6 according to a further embodiment of the invention. As shown FIG. 10, this semiconductor package 6 is structurally similar to that shown in FIG. 9 and differs in the use of a QFN (Quad Flat Non-leaded) package structure in which the leads 52' do not have an exposed outer part as compared to the foregoing leads 52, and the bottom surface 50a of the die pad 50 is exposed from the encapsulation body 55.

It is a characteristic feature that the lead frame according to the invention is formed with a plurality of grounding portions protruded from the die pad to provide good grounding effect for the semiconductor package, such that there is no need to form a complex grounding ring, and the fabrication cost of the semiconductor package can be reduced. Moreover, this lead frame can also prevent the grounding wires attached to the grounding portions from breakage by residual thermal stress in high-temperature manufacturing processes, such that the production yield of the semiconductor package is greatly enhanced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A lead frame comprising:
   a die pad having a top surface for mounting at least one semiconductor chip thereon, and a bottom surface;
   a plurality of grounding portions protruded from the die pad and formed on at least a side of the die pad, each of the grounding portions having a grounding surface, wherein the thickness of the grounding portions is smaller than that of the die pad, and a ground pad is formed on the grounding surface of each of the grounding portions, allowing a plurality of grounding wires to be respectively bonded to the ground pads of the grounding portions and the semiconductor chip for transmitting ground signals; and
   a plurality of leads surrounding the die pad, for allowing a set of bonding wires to be bonded to the leads and the semiconductor chip so as to electrically connect the semiconductor chip to the leads.

2. The lead frame of claim 1, wherein the grounding surface is lower in elevation than the top surface of the die pad.

3. The lead frame of claim 1, wherein the grounding surface is flush with the top surface of the die pad.

4. The lead frame of claim 1, wherein the thickness of the grounding portion is half of the thickness of the die pad.

5. The lead frame of claim 1, wherein the lead frame is made of copper or copper alloy.

6. The lead frame of claim 1, wherein the leads are higher in elevation than the die pad.

7. The lead frame of claim 1, further comprising a plurality of tie bars connected to the die pad.

8. The lead frame of claim 1, wherein the lead frame is used in a quad flat package (QFP) or quad flat non-leaded (QFN) package.

9. A semiconductor package, comprising:
   at least one semiconductor chip;
   a lead frame for carrying the semiconductor chip, comprising:
   a die pad having a top surface and a bottom surface, with the semiconductor chip mounted on the top surface;
   a plurality of grounding portions protruded from the die pad and formed on at least a side of the die pad, each of the grounding portions having a grounding surface and a bottom surface opposed to the grounding surface, wherein the thickness of the grounding portions is smaller than that of the die pad, and a ground pad is formed on the grounding surface of each of the grounding portions, allowing a plurality of grounding wires to be respectively bonded to the ground pads of the grounding portions and the semiconductor chip for transmitting ground signals; and a plurality of leads bonded with a set of bonding wires that are connected to the semiconductor chip so as to electrically connect the semiconductor chip to the leads via the set of bonding wires; and an encapsulation body for encapsulating the semiconductor chip, the die pad, the grounding portions and part of the leads.

10. The semiconductor package of claim 9, wherein the grounding surface is lower in elevation than the top surface of the die pad.

11. The semiconductor package of claim 9, wherein the grounding surface is flush with the top surface of the die pad.

12. The semiconductor package of claim 9, wherein the thickness of the grounding portion is half of the thickness of the die pad.

13. The semiconductor package of claim 9, wherein a height difference is formed between the die pad and the leads.

14. The semiconductor package of claim 13, wherein the leads are higher in elevation than the die pad.

15. The semiconductor package of claim 9, wherein the lead frame further comprises a plurality of tie bars connected to the die pad.

16. The semiconductor package of claim 9, wherein the bottom surface of the die pad is exposed from the encapsulation body.

17. The semiconductor package of claim 9, wherein the bottom surface of the die pad and the bottom surface of the grounding portion are exposed from the encapsulation body.

18. The semiconductor package of claim 9, wherein the semiconductor chip is attached to the die pad via an adhesive.

19. The semiconductor package of claim 18, wherein the adhesive is a silver paste or polyimide tape.

20. The semiconductor package of claim 9, wherein the semiconductor package is a quad flat package (QFP) or quad flat non-leaded (QFN) package.

* * * * *